United States Patent
Shim et al.

(10) Patent No.: US 7,817,737 B2
(45) Date of Patent: Oct. 19, 2010

(54) METHOD OF GENERATING MULTI-CHANNEL LOCAL OSCILLATION FREQUENCIES

(75) Inventors: Yuna Shim, Daejeon (KR); Dae Young Yoon, Daejeon (KR); Sang Gug Lee, Daejeon (KR); Jeong Hoon Kim, Gyunggi (KR); Eung Ju Kim, Gyunggi-do (KR); Tah Joon Park, Gyunggi-do (KR)

(73) Assignees: Samsung Electro-Mechanics Co., Ltd., Gyunggi-do (KR); Information & Communications University, Daejeon (KR)

( * ) Notice: Subject to any disclaimer, the term of this patent is extended or adjusted under 35 U.S.C. 154(b) by 652 days.

(21) Appl. No.: 11/773,261

(22) Filed: Jul. 3, 2007

(65) Prior Publication Data

US 2008/0130713 A1 Jun. 5, 2008

(30) Foreign Application Priority Data

Jul. 5, 2006 (KR) ........................ 10-2006-0062802

(51) Int. Cl.
*H04K 1/10* (2006.01)
*H04L 25/49* (2006.01)

(52) U.S. Cl. ...................................... 375/260; 375/296

(58) Field of Classification Search ................. 375/146, 375/260, 307, 285, 295, 296, 375, 376, 377; 327/119–121, 156, 147; 331/46, 48–49, 331/51, 53, 18, 37, 40, 50; 370/281, 295, 370/330, 343–344, 436, 478, 480; 455/75, 455/86, 165, 255, 259, 260, 266, 313, 323, 455/318

See application file for complete search history.

(56) References Cited

U.S. PATENT DOCUMENTS

| | | | | |
|---|---|---|---|---|
| 5,220,201 A | * | 6/1993 | Kawasaki et al. | 327/156 |
| 7,065,172 B2 | * | 6/2006 | Xiu et al. | 375/376 |
| 7,271,678 B2 | * | 9/2007 | Lee et al. | 332/127 |
| 7,373,113 B2 | * | 5/2008 | Lee et al. | 455/75 |
| 7,536,163 B2 | * | 5/2009 | Kang et al. | 455/316 |
| 2005/0013344 A1 | * | 1/2005 | Abdellaoui et al. | 375/130 |

FOREIGN PATENT DOCUMENTS

KR 1020050069297 A 7/2005

OTHER PUBLICATIONS

Mishra et al., Frequency Planning and Synthesizer Architectures for Multiband OFDM UWB Radios, Dec. 2005, IEEE Transactions on Microwave Theory and Techniques, vol. 53, No. 12, pp. 3744-3756.*
"MBOA-SIG, MultiBand OFDM Alliance SIG", MultiBand OFDM Physical Layer Proposal for IEEE 802.15 Task Group, 3a, Sep. 14, 2004, 125 pages.

* cited by examiner

*Primary Examiner*—Tesfaldet Bocure
*Assistant Examiner*—Lawrence B Williams (57) ABSTRACT

A method of generating multi-channel local oscillation frequencies in an ultra wide band communication system includes generating: at least one reference frequency, a plurality of auxiliary frequencies by dividing and multiplying the at least one reference frequency, and a plurality of first local oscillation frequencies by mixing the reference frequency and at least some of the plurality of auxiliary frequencies with other auxiliary frequencies.

7 Claims, 6 Drawing Sheets

METHOD OF GENERATING MULTI-CHANNEL LOCAL OSCILLATION FREQUENCIES

CLAIM OF PRIORITY

This application claims the benefit of Korean Patent Application No. 2006-0062802 filed on Jul. 5, 2006, in the Korean Intellectual Property Office, the disclosure of which is incorporated herein by reference.

BACKGROUND OF THE INVENTION

1. Field of the Invention

The present invention relates to a method of generating multi-channel local oscillation frequencies in an ultra wide band communication system, and more particularly, to a method of generating multi-channel local oscillation frequencies in an ultra wide band communication system, the method in which interference with communication via another channel by an unnecessary side band frequency, which may be generated when local oscillation frequencies are generated by using a single side band mixer, is prevented.

2. Description of the Related Art

In general, an ultra wide band communication system has a capacity to transmit a large amount of information per unit time with use of a plurality of sub-band frequency bands each having a certain bandwidth when transmitting desired data.

To realize such an ultra wide band communication system, two methods have been proposed currently; multi-band orthogonal frequency division multiplexing (MB-OFDM) including multiple channels of 528 MHz and direct sequence code division multiple access (DS-CDMA), an access scheme based on impulse radio spread spectrums of two bands. The MB-OFDM of multi-band access scheme offers flexible use despite country specific frequency allocation, and thus is actively developed.

In the MB-OFDM, the entire frequency band from 3.1 to 10.6 GHz is divided into five band groups, and each band group includes multiple channels each having a bandwidth of 528 MHz. The three channels of band group 1, which is the lowest frequency band, are compulsory while the rest of the band groups are optional. In a MB-OFDM UWB communication system, since fourteen channels may be formed in the band of 3.1 to 10.6 GHz, one local oscillation frequency per each channel or a total of fourteen local oscillation frequencies are needed.

Figure 1:
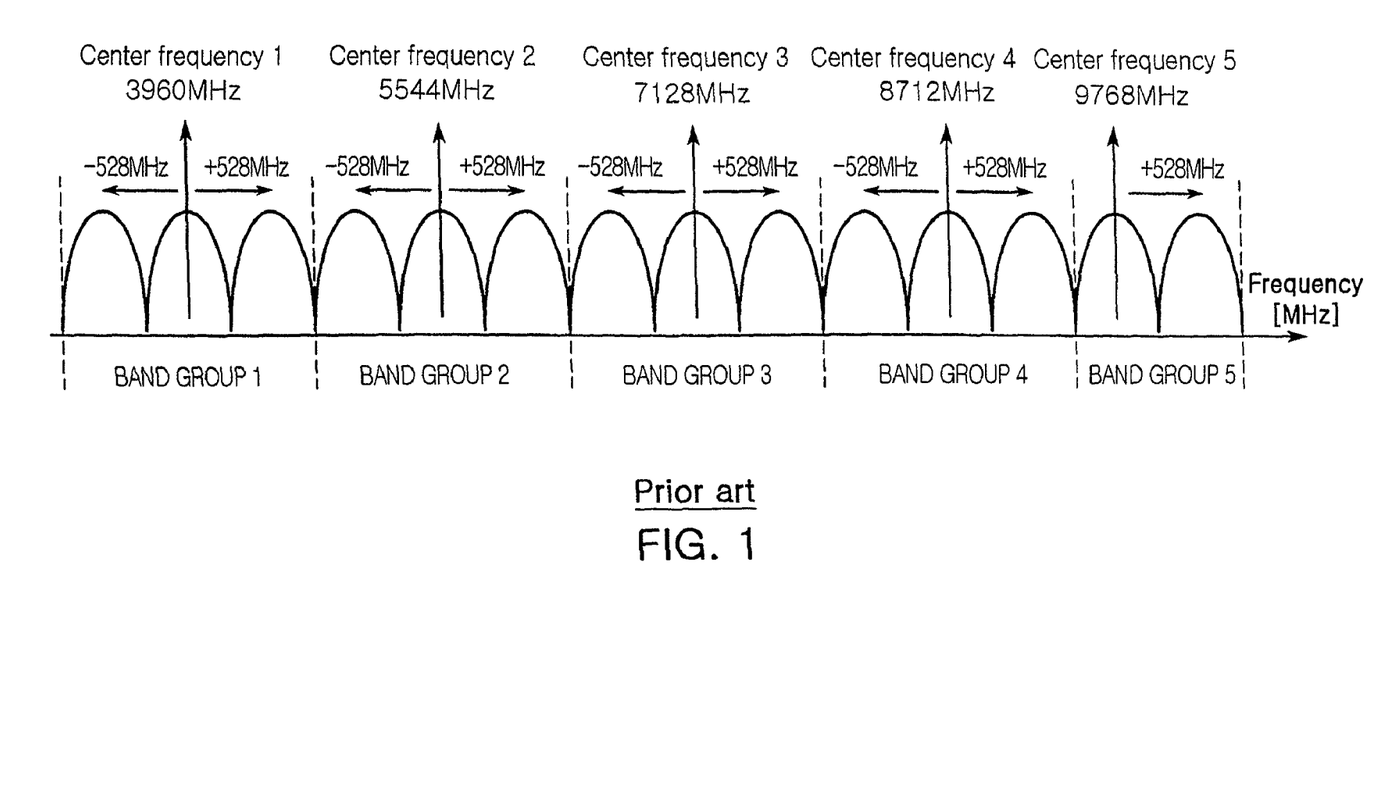
FIG. 1 is a view illustrating a conventional method of generating multi-channel local oscillation frequencies.
Figure 2:
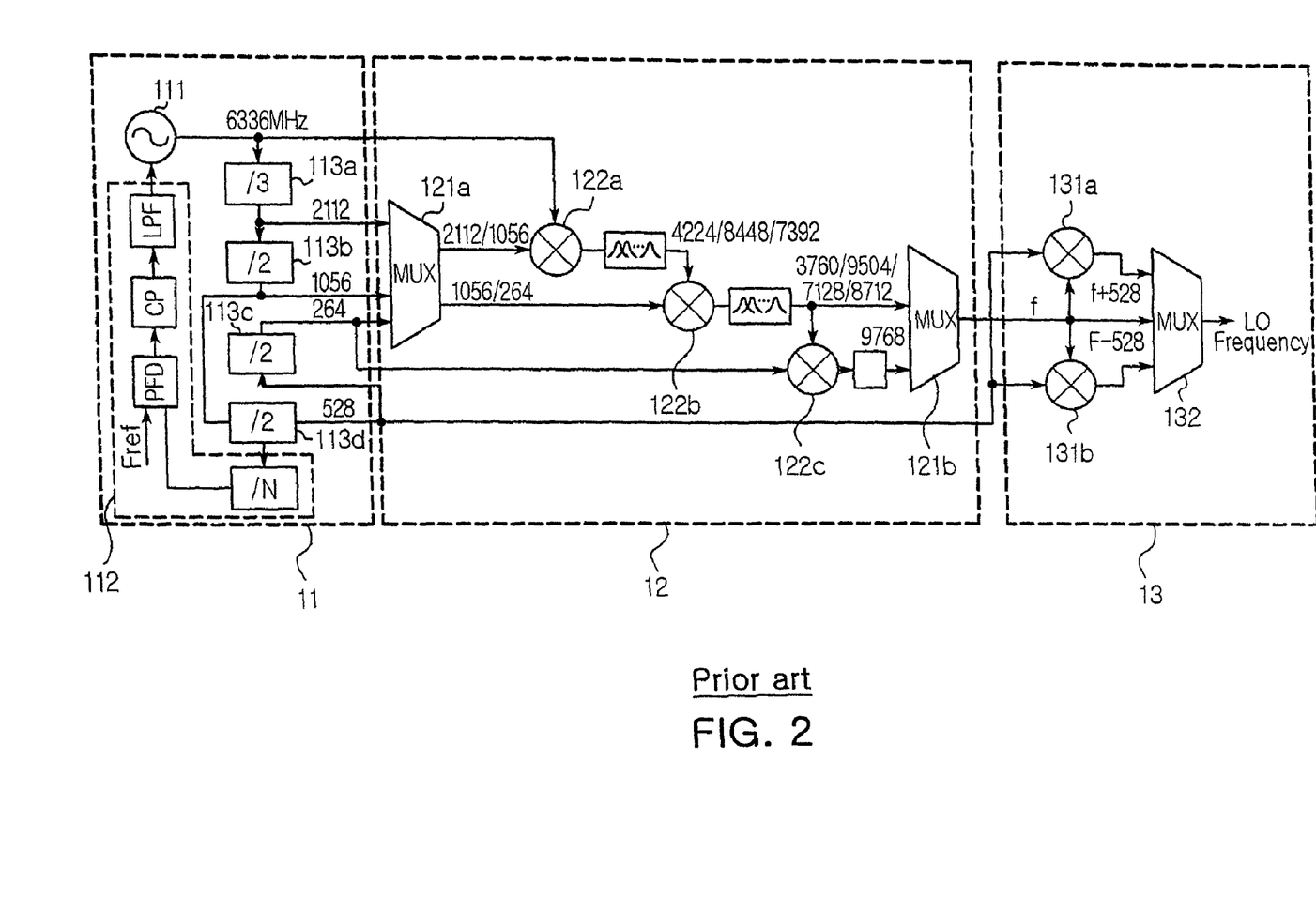
FIG. 2 is a view illustrating a conventional apparatus generating the multi-channel local oscillation frequencies.

FIG. 1 illustrates a conventional method of generating multi-channel local oscillation frequencies. The method shown in FIG. 1 is proposed in "Multi-band OFDM physical layer proposal for IEEE 802.15 Task Group 3a," and is most widely used currently. As shown in FIG. 1, in the conventional method of generating local oscillation frequencies, center frequencies for the respective band groups are generated and each of the center frequencies is down-converted and up-converted by 528 MHz, thereby obtaining local oscillation frequencies for the fourteen channels in the MB-OFDM system. In this case, a signal of 528 MHz is an adjustment frequency for up-converting and down-converting each of the center frequencies of the band groups. FIG. 2 illustrates a conventional apparatus generating local oscillation frequencies.

As shown in FIG. 2, the conventional apparatus, generating the local oscillation frequencies, includes a voltage control oscillator 111 generating a reference frequency (e.g. 6336 MHz); a phase-locked loop (PLL) 112 fixing an output frequency of the voltage control oscillator 111; an auxiliary frequency generator 11 including a plurality of dividers generating a plurality of auxiliary frequencies (e.g. 264 MHz, 528 MHz, 1056 MHz and 2112 MHz) by dividing the reference frequency; a center frequency generator 12 including multiplexers 121a and 121b selectively outputting the reference frequency and the auxiliary frequencies and a plurality of single side band mixers 122a to 122c generating center frequencies of the respective band groups by selectively mixing the reference frequency and the auxiliary frequencies; and a local oscillation frequency generator 13 including single side band mixers 131a and 131b generating multi-channel local oscillation frequencies by up-converting and down-converting the center frequencies by 528 MHz and a multiplexer MUX 132 selectively outputting the multi-channel local oscillation frequencies.

In the conventional apparatus generating multi-channel local oscillation frequencies, a plurality of auxiliary frequencies for generating the multi-channel local oscillation frequencies are generated at the auxiliary frequency generator 11, the center frequencies f for the respective band groups are generated at the center frequency generator 12 by using the reference frequency and the auxiliary frequencies, and three local oscillation frequencies (f−528 MHz, f and f+528 MHz) for the channels in each band group are generated at the local oscillation frequency generator 13 by up-converting and down-converting each of the center frequencies f by 528 MHz.

The above-described conventional apparatus may generate local oscillation frequencies not interfering with an adjacent channel as long as the respective components operate in an ideal condition. However, the single side band mixer or the dividing circuit actually employed may not always operate in an ideal condition, which leaves possibility for interference with an adjacent channel. In particular, in the case of MB-OFDM system in which the frequency intervals among the adjacent channels are all identical (e.g., 528 MHz), the non-ideal characteristics of the single side band mixer may be a problem. For instance, when the single side band mixers 131a and 131b operate in an ideal condition in the local oscillation frequency generator 13, a clean single frequency component will be outputted from the multiplexer 132 of the local oscillation frequency generator 13. However, if the single side bandmixers 131a and 131b do not operate in an ideal condition, a desired signal of f+528 MHz as well as a side band frequency of f−528 MHz are outputted from the single side band mixer 131a for up-converting the center frequency by 528 MHz. In the same fashion, a desired signal of f−528 MHz as well as a component of f+528 MHz are outputted from the single side band mixer 131b for down-converting the center frequency f. Due to these side band frequencies, interference may occur with another adjacent ultra wide band communication device. That is, because of the side band component of f−528 MHz outputted from the single side band mixer operating in a non-ideal condition, the ultra wide band communication device using the local oscillation frequency of f+528 MHz may interfere with another adjacent ultra wide band communication device using a local oscillation frequency of f−528 MHz.

SUMMARY OF THE INVENTION

An aspect of the present invention provides a method of generating a multi-channel local oscillation frequency, the method in which even if a non-ideal single side band mixer is employed, there is no frequency overlapping with an adjacent ultra wide band communication device, thereby preventing interference.

According to an aspect of the invention, there is provided a method of generating multi-channel local oscillation frequencies in an ultra wide band communication system having multiple channels of identical bandwidth, the method including: generating at least one reference frequency; generating a plurality of auxiliary frequencies by dividing and multiplying the at least one reference frequency; and generating a plurality of first local oscillation frequencies by mixing the reference frequency and at least some of the plurality of auxiliary frequencies with other auxiliary frequencies, respectively, wherein each of the auxiliary frequencies used in the mixing is greater than an interval between the frequency being mixed and an outermost frequency in the ultra wide band.

The method may further include generating a plurality of second local oscillation frequencies by mixing at least one of the first local oscillation frequencies with at least one of the auxiliary frequencies, respectively, wherein each of the auxiliary frequencies used in the mixing is greater than an interval between the frequency being mixed and an outermost frequency of the ultra wide band.

The mixing may be performed by using a single side band mixer.

An exemplary embodiment of the present invention as described hereunder may be applied to generate multi-channel local oscillation frequencies designated by the standard of the ultra wide band.

The reference frequencies may be 9504 MHz and 11352 MHz, of which the 9504 MHz is used to generate a plurality of auxiliary frequencies. In detail, the generating a plurality of auxiliary frequencies may include: generating 3168 MHz by dividing the 9504 MHz by 3; generating 2376 MHz by dividing the 9504 MHz by 4; generating 1584 MHz by dividing the 3168 MHz by 2; generating 1056 MHz by dividing the 3168 MHz by 3; generating 2112 MHz by multiplying the 1056 MHz by 2; and generating 4224 MHz by multiplying the 2112 MHz by 2.

The auxiliary frequencies are applied to the generating a plurality of first local oscillation frequencies. In detail, the generating a plurality of first local oscillation frequencies may include: generating a first local oscillation frequency of 3432 MHz by mixing the 2376 MHz with the 1056 MHz; generating a first local oscillation frequency of 3960 MHz by mixing the 2376 MHz with the 1584 MHz; generating a first local oscillation frequency of 4488 MHz by mixing the 2376 MHz with the 2112 MHz; generating a first local oscillation frequency of 6600 MHz by mixing the 2376 MHz with the 4224 MHz; generating a first local oscillation frequency of 10296 MHz by mixing the 11352 MHz with the 1056 MHz; generating a first local oscillation frequency of 9768 MHz by mixing the 11352 MHz with the 1584 MHz; and generating a first local oscillation frequency of 9240 MHz by mixing the 11352 MHz with the 2112 MHz.

Further, the auxiliary frequencies and some of the first local oscillation frequencies may be used to additionally generate second local oscillation frequencies. In detail, the generating a plurality of second local oscillation frequencies may include: generating a second local oscillation frequency of 8712 MHz by mixing the first local oscillation frequency of 10296 MHz with the 1584 MHz; generating a second local oscillation frequency of 8184 MHz by mixing the first local oscillation frequency of 9768 MHz with the 1584 MHz; generating a second local oscillation frequency of 7656 MHz by mixing the first local oscillation frequency of 9240 MHz with the 1584 MHz; and generating a second local oscillation frequency of 7128 MHz by mixing the first local oscillation frequency of 9240 MHz with the 2112 MHz.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

The present invention will be described more fully hereinafter with reference to the accompanying drawings, in which preferred embodiments of the invention are shown. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions of the components may be exaggerated for clarity.

Figure 3:
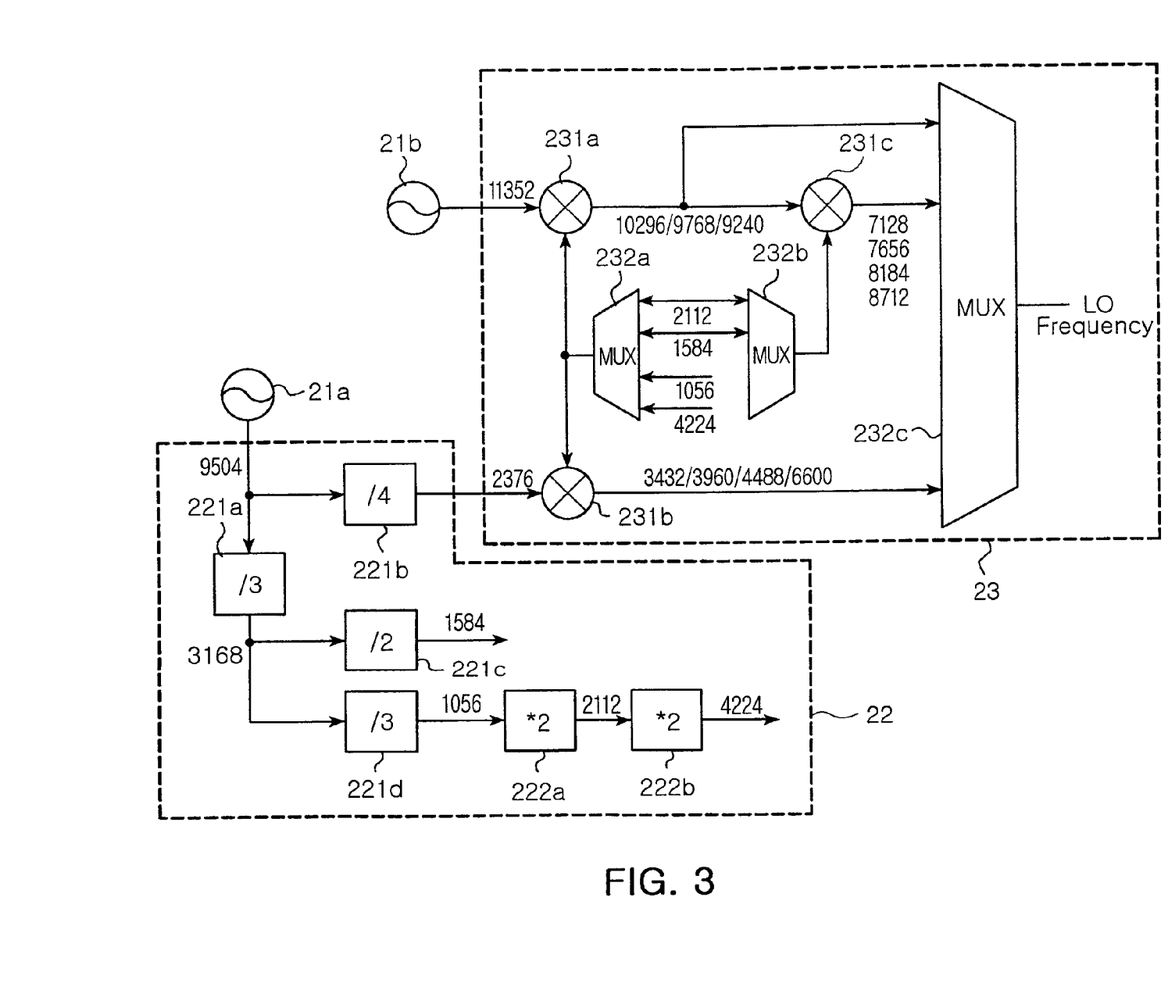
FIG. 3 is a view illustrating an apparatus generating multi-channel local oscillation frequencies according to an exemplary embodiment of the present invention.

FIG. 3 is a view illustrating an apparatus generating a multi-channel local oscillation frequency according to an exemplary embodiment of the present invention. The apparatus generating multi-channel local oscillation frequencies, shown in FIG. 3, includes two local oscillators 21a and 21b generating reference frequencies, respectively; an auxiliary frequency generator 22 generating a plurality of auxiliary frequencies by multiplying and dividing one of the reference frequencies, generated from one local oscillator 21a; and a local oscillation frequency generator 23 generating multi-channel local oscillation frequencies by selectively mixing the other one of the reference frequencies, generated from the local oscillator 21b, with the auxiliary frequencies.

The auxiliary frequency generator 22 includes at least one divider 221a to 221d and at least one multiplier 222a and 222b. In addition, the local oscillation frequency generator 23 includes a plurality of single side band mixers 231a to 231c mixing the reference frequency with the auxiliary frequencies to obtain desired frequencies and a plurality of multiplexers MUX 232a to 232c selectively outputting the plurality of auxiliary frequencies.

Figure 4:
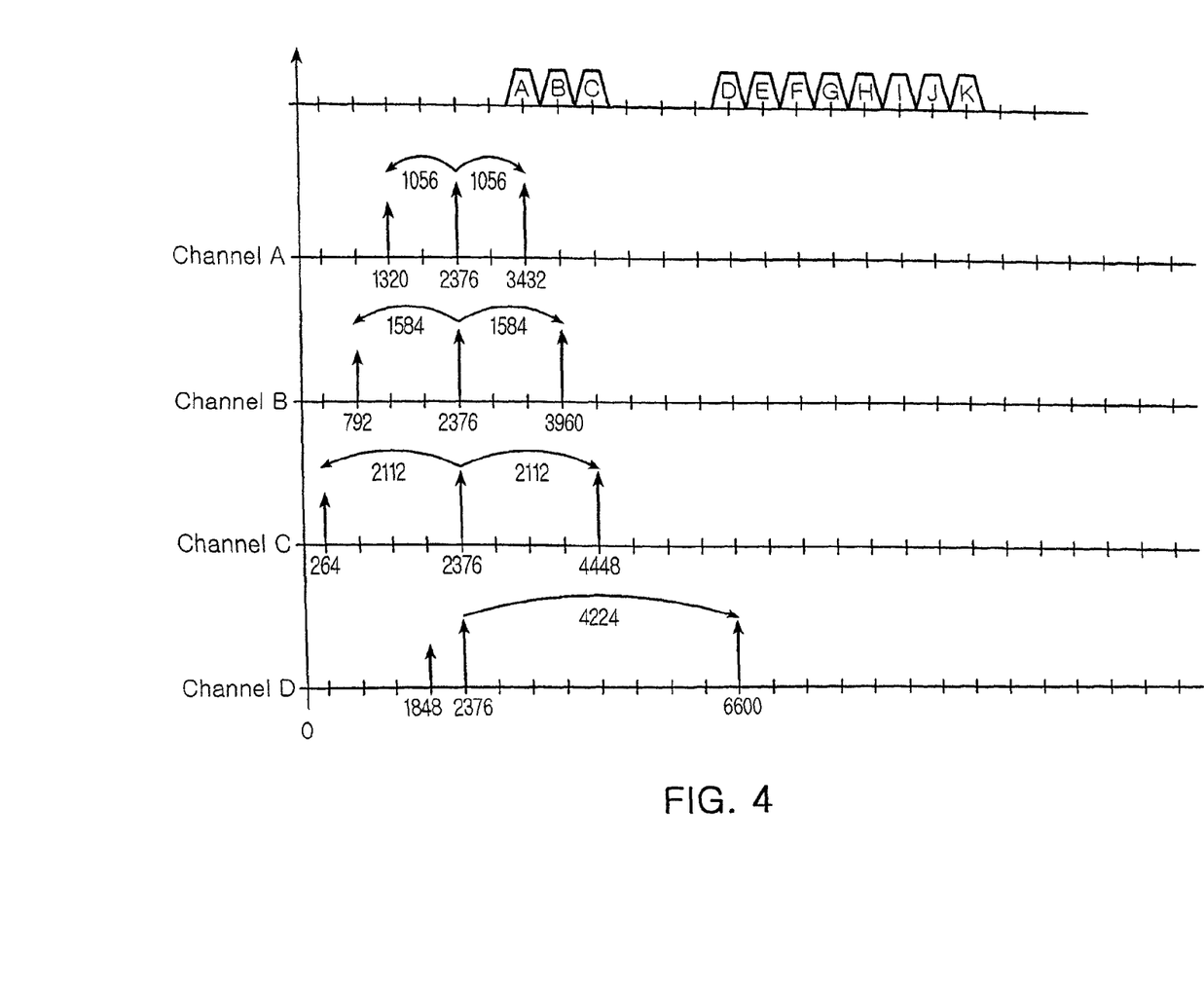
FIGS. 4 through 6 are views illustrating a method of generating multi-channel local oscillation frequencies according to an exemplary embodiment of the present invention.
Figure 5:
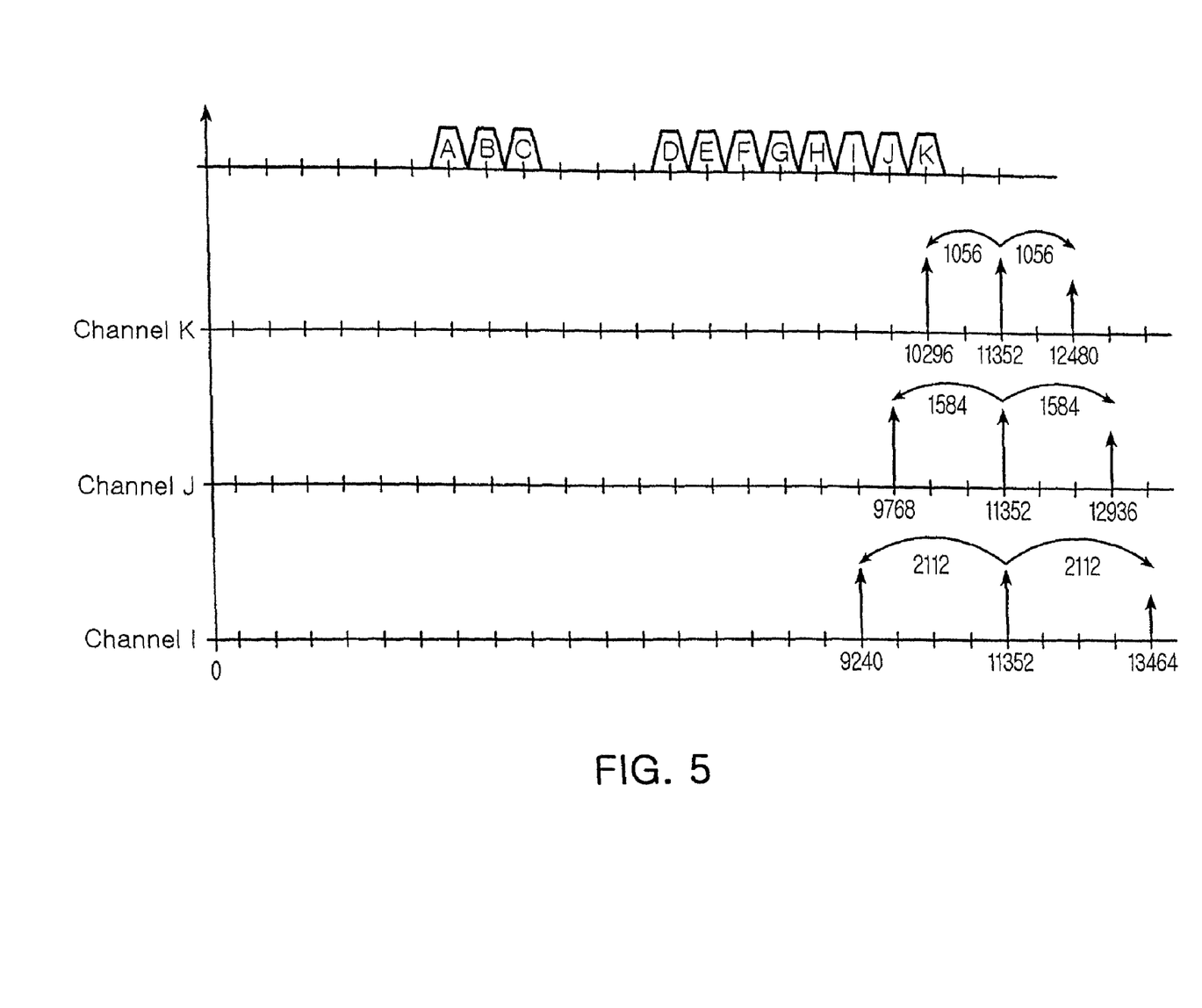
Figure 6:
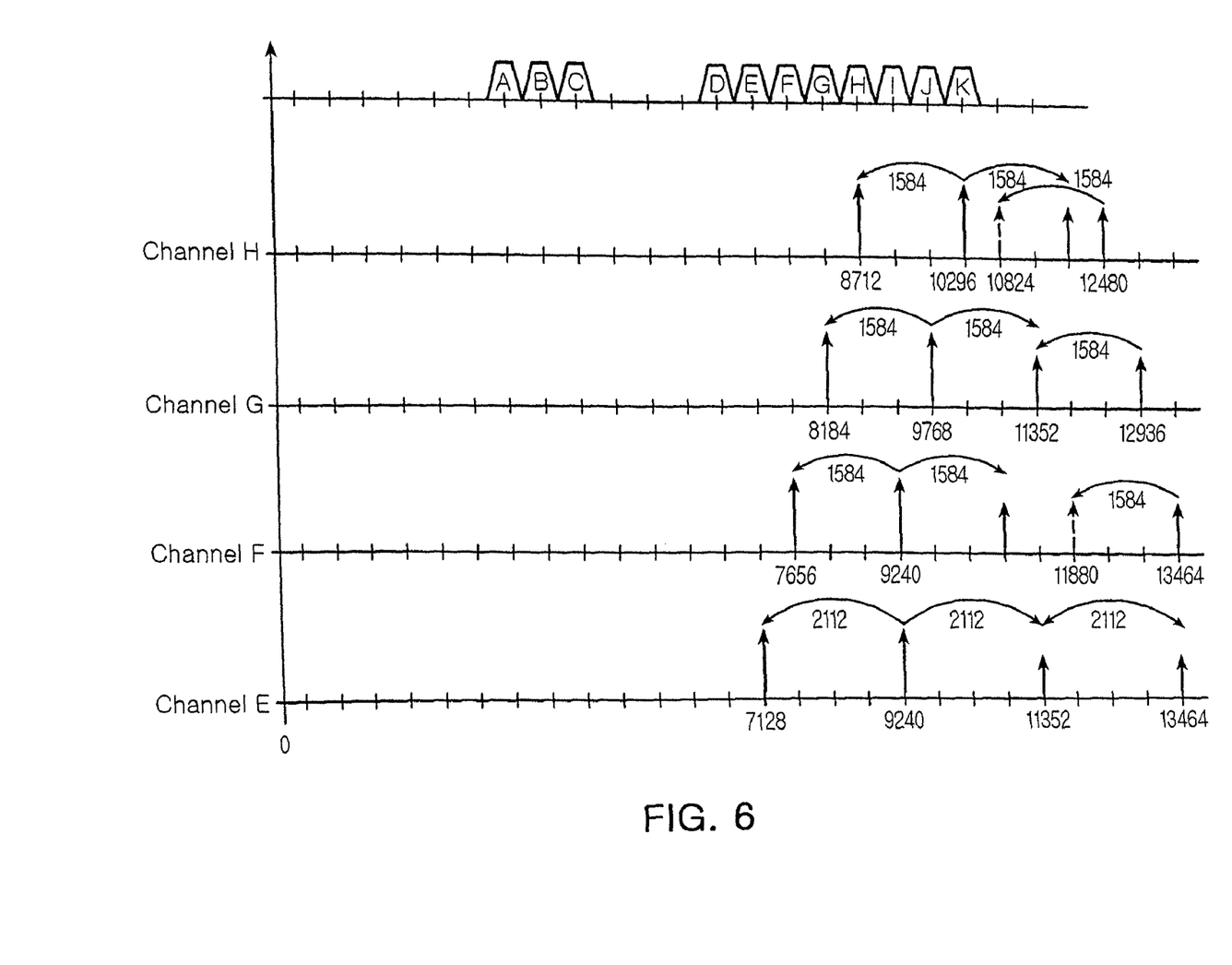

FIGS. 4 to 6 are views illustrating processes, in which local oscillation frequencies are generated by selectively mixing the reference frequencies with the plurality of auxiliary frequencies, for respective channels.

Before describing the operations of the present invention, band groups and channels designated in an ultra wide band communication system employing multi-band orthogonal frequency division multiplexing (MB-OFDM) will be briefly described with reference to FIG. 1. As shown in FIG. 1, an entire frequency band designated in the MB-OFDM ultra wide band communication system is from 3168 MHz to 10560 MHz, and is divided into five band groups. Each band group includes two or three channels, and communication of an ultra wide band communication device is performed via each channel. Each channel has a bandwidth of 528 MHz, and thus the entire band used for the ultra wide band communication system is a multi-channel structure made up of a total of fourteen channels. For communication to take place via a channel, a local oscillation frequency corresponding to a center frequency of a bandwidth of the corresponding channel is required, and thus a total of fourteen local oscillation frequencies are required. The relationship among the entire band, the band groups and the channels in the ultra wide band system may be organized as follows in Table 1 below.

iliary frequency generator 22 transmits the auxiliary frequencies of 1056 MHz, 1584 MHz, 2112 MHz, 2376 MHz and 4224 MHz to the local oscillation frequency generator 23.

Next, the local oscillation frequency generator 23 generates the local oscillation frequencies for the respective channels by using the other reference frequency, outputted from the second local oscillator 21b, and the auxiliary frequencies.

TABLE 1

| Ultra Wide Band (UWB) (3168 MHz to 10560 MHz) | | | | | | | | | | | | | |
|---|---|---|---|---|---|---|---|---|---|---|---|---|---|
| Band group 1 | | | Band group 2 | | | Band group 3 | | | Band group 4 | | | Band group 5 | |
| | | | | | | | | | Channel | Channel | Channel | | Channel |
| Channel A | Channel B | Channel C | Channel | Channel | Channel | Channel D | Channel E | Channel F | G | H | I | Channel J | K |
| 3432 | 3960 | 4488 | 5016 | 5544 | 6072 | 6600 | 7128 | 7656 | 8184 | 8712 | 9240 | 9768 | 10296 |

In the above Table 1, no alphabetical signs are given to the channels of band group 2.

Since large signals are applied to a frequency band of 5.15 to 5.824 GHz (a wireless local area network (WLAN) band), no local oscillation frequencies for converting this frequency band are generated in the band of 5.15 to 5.824 GHz. Therefore, even though a total number of local oscillation frequencies designated in the ultra wide band communication system is fourteen, three local oscillation frequencies for channels of band group 2 are not generated and eleven local oscillation frequencies are generated in the method according to an exemplary embodiment of the present invention. Thus, the channels of band group 2 are not given any signs, which will also be applied to FIGS. 4 through 6. In Table 1, the value written below each channel is the local oscillation frequency used for each channel and the unit is in MHz.

In addition, for the sake of convenience in describing the components with identical names with reference to FIG. 3, the components are denoted by following names and reference numerals. Reference numerals 21a and 21b denote a first local oscillator and a second local oscillator, respectively, reference numerals 221a to 221d denote first to fourth dividers, respectively, reference numerals 222a and 222b denote first and second multipliers, respectively, reference numerals 231a to 231c denote first to third mixers, respectively, and reference numerals 232a to 232c denote first to third multiplexers, respectively.

Hereinafter, the operations of the present invention will be described with reference to FIGS. 3 to 6 in greater detail.

First, the first local oscillator 21a and the second local oscillator 21b generate reference frequencies of 9504 MHz and 11352 MHz, respectively.

Next, the auxiliary frequency generator 22 generates a plurality of auxiliary frequencies by dividing and multiplying the reference frequency of 9504 MHz. In detail, the first divider 221a divides the frequency of 9504 MHz by 3 to generate a frequency of 3168 MHz and the third divider 221c divides the 3168 MHz by 2 to generate a frequency of 1584 MHz. In addition, the fourth divider 221d divides the 3168 MHz, generated by the first divider 221a, by 3 to generate 1056 MHz. In addition, the first multiplier 222a multiplies the 1056 MHz, outputted from the fourth divider 221d, by 2 to generate 2112 MHz and the second multiplier 222b multiplies the 2112 MHz by 2 to generate 4224 MHz. In the meantime, the second divider 221b divides the reference frequency of 9504 MHz by 4 to generate 2376 MHz. The aux- The local oscillation frequency of 3432 MHz of channel A, shown in FIG. 1, is generated by mixing the auxiliary frequency of 2376 MHz with the auxiliary frequency of 1056 MHz in the second mixer 231b of the local oscillation frequency generator 23. In this case, the first multiplexer MUX 232a selects the 1056 MHz among the auxiliary frequencies of 1056 MHz, 1584 MHz, 2112 MHz and 4224 MHz and provides the 1056 MHz to the second mixer 231b. The second mixer 231b may be a single side band mixer only up-converting the frequency of 2376 MHz. However, as shown in FIG. 4, the non-ideal single side band mixer in actuality generates a side band frequency, downward from the 2376 MHz, i.e., an unnecessary frequency of 1320 MHz. However, different from the conventional method described above, this side band frequency of 1320 MHz exists outside the entire frequency band of the ultra wide band communication system. This is because the auxiliary frequency used in the mixing is determined to be greater than an interval between the frequency being mixed and an outermost frequency of the ultra wide band.

In the same fashion as the process of generating the local oscillation frequency for channel A, the frequency of 2376 MHz, outputted from the second divider 221b, is mixed with the 1584 MHz selected and provided by the first multiplexer MUX 232a and thereby converted to 3960 MHz for channel B. As described above, since the frequency of 1584 MHz used in the mixing is determined to be greater than an interval between the 2376 MHz being mixed and an outermost frequency of the entire frequency band of the ultra wide band communication system, the side band frequency (792 MHz) generated by non-ideal characteristics of the single side band mixer exists outside the band of the ultra wide band communication system. This prevents the phenomenon in which the side band frequency generated by non-ideal characteristics of the single side band mixer interferes with another ultra wide band communication device using a different channel.

The same process as described above are applied to generate local oscillation frequencies of 4488 MHz and 6600 MHz for channel C and channel D, respectively, and the side band frequencies generated by non-ideal characteristics of the single side band mixer exist outside the band of the ultra wide band communication system as described above.

Similar to the process shown in FIG. 4, a process of generating local oscillation frequencies for channel K, channel J and channel I is shown in FIG. 5. The reference frequency of 11352 MHz, generated from the second local oscillator 21b, is mixed with the 1056 MHz, provided from the first multiplexer 232a to the first mixer 231a, and thereby down-converted to a local oscillation frequency of 10296 MHz for channel K. As shown in FIG. 4, an unnecessary frequency (12480 MHz) generated by the non-ideal single side band mixer exists outside the band of the ultra wide band communication system. In the same fashion, the reference frequency of 11352 MHz, generated from the second local oscillator 21b, is mixed with the 1584 MHz and the 2112 MHz, provided from the first multiplexer 232a to the first mixer 231a, to generate a local oscillation frequency of 9768 MHz for channel J and a local oscillation frequency of 9240 MHz for channel I, respectively.

In FIG. 6, the local oscillation frequencies of 10296 MHz, 9768 MHz and 9240 MHz, generated as described above with reference to FIG. 5, are mixed with at least one of the auxiliary frequencies to generate local oscillation frequencies for channel H, channel G, channel F and channel E, respectively. Each of the local oscillation frequencies of 10296 MHz, 9768 MHz and 9240 MHz, generated from the first mixer 231a, is mixed with at least one of the auxiliary frequencies of 1584 MHz and 2112 MHz, selected and provided from the second multiplexer 232b, at the third mixer 231C and thereby downconverted. As described above, the auxiliary frequency used in the mixing is determined to be greater than an interval between the frequency being mixed and an outermost frequency of the frequency band so that an unnecessary side band frequency generated by a non-ideal single side band filter may be formed outside the ultra wide band communication frequency band.

To generate a local oscillation frequency of 8712 MHz for channel H, the local oscillation frequency of 10296 MHz for channel K, outputted from the first mixer 231a, is mixed with the 1584 MHz, outputted from the second multiplexer 232b, in the third mixer 231c. In the same fashion, local oscillation frequencies of 8184 MHz, 7656 MHz and 7128 MHz are generated for channel G, channel F and channel E, respectively.

In the meantime, the unnecessary side band frequency of the local oscillation frequency outputted from the first mixer 231a is also converted by the frequency used in the mixing at the third mixer 231c. Therefore, in order to prevent the unnecessary side band frequency, outputted from the first mixer 231a, from being converted to exist in the ultra wide band communication band by the mixing, the auxiliary frequency used in the mixing at the third mixer 231c may be determined to be smaller than an interval between the side band frequency generated from the first mixer 231a and an outermost frequency of the ultra wide communication band.

In the method of generating multi-channel local oscillation frequencies according to an exemplary embodiment of the present invention, even if a non-ideal single side band mixer is used in frequency conversion, a side band frequency component does not overlap with a channel of another ultra wide band communication device in the conversion process, thereby preventing interference. In addition, the side band frequency rarely affects a carrier interferer ratio (CIR), thereby preventing noise in the system.

According to the present invention as set forth above, an unnecessary side band frequency component generated by a non-ideal single side band mixer is not formed within an ultra wide communication band, and as a result, there is no frequency component overlapping with a different channel of an adjacent ultra wide band communication device. This prevents interference with another communication device and noise in a system, ultimately improving a capability of an ultra wide band communication system.

While the present invention has been shown and described in connection with the exemplary embodiments, it will be apparent to those skilled in the art that modifications and variations may be made without departing from the spirit and scope of the invention as defined by the appended claims.

What is claimed is:

1. A method of generating multi-channel local oscillation frequencies in an ultra wide band communication system having multiple channels of identical bandwidth, the method comprising:

generating at least one reference frequency;

generating a plurality of auxiliary frequencies by dividing and multiplying the at least one reference frequency; and generating a plurality of first local oscillation frequencies by mixing the reference frequency and at least some of the plurality of auxiliary frequencies with other auxiliary frequencies, respectively, wherein each of the auxiliary frequencies used in the mixing is greater than an interval between the frequency being mixed and an outermost frequency in the ultra wide band.

2. The method of claim 1, further comprising generating a plurality of second local oscillation frequencies by mixing at least one of the first local oscillation frequencies with at least one of the auxiliary frequencies, respectively, wherein each of the auxiliary frequencies used in the mixing is greater than an interval between the frequency being mixed and an outermost frequency of the ultra wide band.

3. The method of claim 1, wherein the mixing is performed by using a single side band mixer.

4. The method of claim 1, wherein the reference frequencies are 9504 MHz and 11352 MHz.

5. The method of claim 4, wherein the generating a plurality of auxiliary frequencies comprises:

generating 3168 MHz by dividing the 9504 MHz by 3;

generating 2376 MHz by dividing the 9504 MHz by 4;

generating 1584 MHz by dividing the 3168 MHz by 2;

generating 1056 MHz by dividing the 3168 MHz by 3;

generating 2112 MHz by multiplying the 1056 MHz by 2; and generating 4224 MHz by multiplying the 2112 MHz by 2.

6. The method of claim 5, wherein the generating a plurality of first local oscillation frequencies comprises:

generating a first local oscillation frequency of 3432 MHz by mixing the 2376 MHz with the 1056 MHz;

generating a first local oscillation frequency of 3960 MHz by mixing the 2376 MHz with the 1584 MHz;

generating a first local oscillation frequency of 4488 MHz by mixing the 2376 MHz with the 2112 MHz;

generating a first local oscillation frequency of 6600 MHz by mixing the 2376 MHz with the 4224 MHz;

generating a first local oscillation frequency of 10296 MHz by mixing the 11352 MHz with the 1056 MHz;

generating a first local oscillation frequency of 9768 MHz by mixing the 11352 MHz with the 1584 MHz; and generating a first local oscillation frequency of 9240 MHz by mixing the 11352 MHz with the 2112 MHz.

7. The method of claim 6, wherein the generating a plurality of second local oscillation frequencies comprises:

generating a second local oscillation frequency of 8712 MHz by mixing the first local oscillation frequency of 10296 MHz with the 1584 MHz;

generating a second local oscillation frequency of 8184 MHz by mixing the first local oscillation frequency of 9768 MHz with the 1584 MHz;

generating a second local oscillation frequency of 7656 MHz by mixing the first local oscillation frequency of 9240 MHz with the 1584 MHz; and generating a second local oscillation frequency of 7128 MHz by mixing the first local oscillation frequency of 9240 MHz with the 2112 MHz.

* * * * *